(12) United States Patent
Kita

(10) Patent No.: US 8,749,695 B2
(45) Date of Patent: Jun. 10, 2014

(54) IMAGING DEVICE AND IMAGING APPARATUS

(75) Inventor: Mitsuaki Kita, Kanagawa (JP)

(73) Assignee: Sony Corporation, Tokyo (JP)

( * ) Notice: Subject to any disclaimer, the term of this patent is extended or adjusted under 35 U.S.C. 154(b) by 11 days.

(21) Appl. No.: 13/312,078

(22) Filed: Dec. 6, 2011

(65) Prior Publication Data

US 2012/0188425 A1    Jul. 26, 2012

(30) Foreign Application Priority Data

Jan. 21, 2011    (JP) ................................. 2011-010323

(51) Int. Cl.
  *H04N 3/14*    (2006.01)
  *H04N 5/335*    (2011.01)
  *G03B 13/00*    (2006.01)
  *H04N 5/232*    (2006.01)

(52) U.S. Cl.
  USPC ............................ 348/345; 348/294; 348/308

(58) Field of Classification Search
  USPC ......................... 348/294–324, 345
  See application file for complete search history.

(56) References Cited

U.S. PATENT DOCUMENTS

| 6,289,008 | B1 * | 9/2001 | Sakamoto et al. | ............ 370/331 |
| 6,829,008 | B1 * | 12/2004 | Saga et al. | .................... 348/302 |
| 7,859,582 | B2 * | 12/2010 | Gomi | ............................ 348/308 |
| 7,989,745 | B2 * | 8/2011 | Suzuki | ....................... 250/201.2 |
| 8,164,679 | B2 * | 4/2012 | Kusaka | ......................... 348/345 |
| 2003/0102424 | A1 * | 6/2003 | Izumi et al. | ................ 250/208.1 |
| 2007/0222882 | A1 * | 9/2007 | Kobayashi | ................... 348/311 |
| 2007/0285548 | A1 * | 12/2007 | Gomi | ............................ 348/308 |
| 2009/0290059 | A1 * | 11/2009 | Suzuki | ......................... 348/308 |
| 2011/0096189 | A1 * | 4/2011 | Taniguchi | .................. 348/222.1 |

FOREIGN PATENT DOCUMENTS

| JP | 4-281681 | 10/1992 |
| JP | 2010220192 | * 9/2010 |

OTHER PUBLICATIONS

U.S. Appl. No. 13/249,428, filed Sep. 30, 2011, Kita, et al.

* cited by examiner

*Primary Examiner* — Timothy J Henn
*Assistant Examiner* — Pritham Prabhakher
(74) *Attorney, Agent, or Firm* — Oblon, Spivak, McClelland, Maier & Neustadt, L.L.P.

(57) ABSTRACT

An imaging device includes: an image generation pixel including a light receiving element generating a signal for generating an image; a phase-difference detection pixel including a light receiving element generating a signal for performing in-focus determination by phase difference detection; and a holding section holding the signal generated by the light receiving element in the image generation pixel and disposed in an area where subject light is shielded by a light shielding layer in the phase-difference detection pixel.

9 Claims, 11 Drawing Sheets

IMAGING DEVICE AND IMAGING APPARATUS

BACKGROUND

The present disclosure relates to an imaging device, and more particularly, to an imaging device including a phase-difference detection pixel and an image generation pixel, and an imaging apparatus.

In recent years, imaging apparatuses, such as digital still cameras and digital video cameras, etc., which capture an image of a subject, such as a person, an animal, etc., using an imaging device to generate image data and record the image data, have become widespread. For example, imaging apparatuses using a CMOS (Complementary Metal Oxide Semiconductor) sensor are widely used now.

This CMOS sensor is an x-y addressing type sensor that reads an image signal for each pixel circuit (pixel) by specifying an x-axis (horizontal direction) and a y-axis (vertical direction). Accordingly, in the imaging apparatus, an image signal is read for each line (horizontally or vertically) in general, and the pixels are exposed in sequence for each line by the reading for each line. Thereby, exposure timing becomes different for each line, and thus when an image of a moving object is captured, a phenomenon that causes the image of the moving object to appear distorted (focal plane phenomenon) occurs.

Thus, a proposal has been made of an imaging apparatus in which generation timing (exposure timing) of image signals are made equal for all the pixels by providing a holding section which holds an image signal for each pixel, for example (for example, refer to Japanese Unexamined Patent Application Publication No. 4-281681).

SUMMARY

In the above-described related art technique, a global shutter function, which makes exposure timing of all the pixels equal, is achieved by reading charge (image signal) accumulated in a light receiving element of each pixel to the holding section at the same time at termination timing of the exposure. Thereby, in the above-described related art technique, it is possible to reduce a focal plane phenomenon.

However, a light receiving element and a holding section are disposed on a same plane in each pixel, and thus an area of a light receiving element of each pixel of the imaging device decreases compared with an imaging apparatus not provided with a holding section (not provided with a global shutter function). Thereby, image quality might be deteriorated because of a decrease in the amount of receiving light caused by a decrease in the light condensing area, and a decrease in a dynamic range because of a decrease in the total amount of accumulable charge, etc. Also, if one imaging device is provided with phase-difference detection pixels for performing phase-difference detection, a number of pixels for generating an image signal decreases, and thus image quality might be further deteriorated. Thus, for example, it becomes important to reduce deterioration of image quality of an image generated by an imaging apparatus provided with a phase-difference detection function and a global shutter function.

The present disclosure has been made in view of these circumstances. It is desirable to reduce deterioration of image quality.

According to an embodiment of the present disclosure, there is provided an imaging device including: an image generation pixel including a light receiving element generating a signal for generating an image; a phase-difference detection pixel including a light receiving element generating a signal for performing in-focus determination by phase difference detection; and a holding section holding the signal generated by the light receiving element in the image generation pixel and disposed in an area where subject light is shielded by a light shielding layer in the phase-difference detection pixel. Thereby, an action is taken to dispose the holding section for a global shutter function of the image generation pixel in an area where subject light is shielded by the light shielding layer of the phase-difference detection pixel.

Also, in the above-described embodiment, at least one pixel among individual pixels adjacent to the image generation pixel may be the phase-difference detection pixel, and the holding section may be disposed between the light receiving element in the image generation pixel and light receiving element in the phase-difference detection pixel. Thereby, an action is taken to dispose the holding section between the light receiving element in the image generation pixel and the light receiving element in the phase-difference detection pixel.

Also, in the above-described embodiment, at least one pixel among individual pixels adjacent to the image generation pixel may be the phase-difference detection pixel, and one end of the holding section in a longitudinal direction in the phase-difference detection pixel and the light receiving element in the image generation pixel may be adjacent to each other. Thereby, an action is taken to dispose pixels such that one end of the holding section in a longitudinal direction in the phase-difference detection pixel and the light receiving element in the image generation pixel are adjacent to each other.

Also, in the above-described embodiment, the image generation pixels and the phase-difference detection pixels may be arranged such that a first line including the image generation pixels arranged in a specific direction and a second line including the phase-difference detection pixels arranged in the specific direction are alternately disposed in an orthogonal direction to the specific direction. Thereby, an action is taken to alternately dispose a row of the image generation pixel and a row of the phase-difference detection pixel.

Also, in this case, the image generation pixels and the phase-difference detection pixels may be arranged alternately such that the image generation pixels included in the first line and the phase-difference detection pixels included in the second line adjacent to the first line are partly overlapped in the orthogonal direction. Thereby, an action is taken to alternately dispose the image generation pixels and the phase-difference detection pixels such that the image generation pixels and the phase-difference detection pixels are overlapped with each other by substantially half of the individual pixels. Also, in this case, the image generation pixels and the phase-difference detection pixels may be arranged in a diagonal pixel array. Thereby, an action is taken to dispose the image generation pixels and the phase-difference detection pixels in a diagonal array.

Also, in this case, the phase-difference detection pixel may be a phase-difference detection pixel performing pupil dividing in a diagonal direction with respect to the specific direction. Thereby, an action is taken to dispose the holding section in the phase-difference detection pixel performing pupil dividing in a diagonal direction with respect to the specific direction.

Also, in the above-described embodiment, the image generation pixel and the phase-difference detection pixel may be substantially square pixels individually having one side in parallel with the specific direction, and may be arranged in a tetragonal lattice. Thereby, an action is taken to dispose the substantially square pixels individually having one side in parallel with the specific direction in a tetragonal lattice.

Also, in the above-described embodiment, at least one pixel among individual pixels adjacent to the image generation pixel may be the phase-difference detection pixel, and the holding section alternately may hold the signal generated by the light receiving element in the phase-difference detection pixel and the signal generated by the light receiving element in the image generation pixel for each frame. Thereby, an action is taken for the holding section to alternately hold the signal generated by the light receiving element in the phase-difference detection pixel on which the holding section is disposed and the signal generated by the light receiving element in the image generation pixel.

Also, according to another embodiment of the present disclosure, there is provided an imaging apparatus including: an imaging device including an image generation pixel including a light receiving element generating a signal for generating an image, a phase-difference detection pixel including a light receiving element generating a signal for performing in-focus determination by phase difference detection, and a holding section holding the signal generated by the light receiving element in the image generation pixel and disposed in an area where subject light is shielded by a light shielding layer in the phase-difference detection pixel; an in-focus determination section performing in-focus determination by phase difference detection on the basis of the signal generated by the phase-difference detection pixel; and a control section controlling drive of a lens on the basis of an in-focus determination result by the in-focus determination section. Thereby, an action is taken for the holding section in the image generation pixel for the global shutter function to perform in-focus determination using the imaging device disposed in an area where subject light is shielded by the light shielding layer in the phase-difference detection pixel.

By the present disclosure, it is possible to produce excellent advantages allowing reduction in deterioration of image quality.

DETAILED DESCRIPTION OF EMBODIMENTS

In the following, descriptions will be given of modes for carrying out the present disclosure (hereinafter called embodiments).

The descriptions will be given in the following order.
1. First embodiment (imaging control: example of diagonal pixel array)
2. Second embodiment (imaging control: example of tetragonal lattice array)
3. Variations

1. First Embodiment

Example of Functional Configuration of Imaging Apparatus

Figure 1:
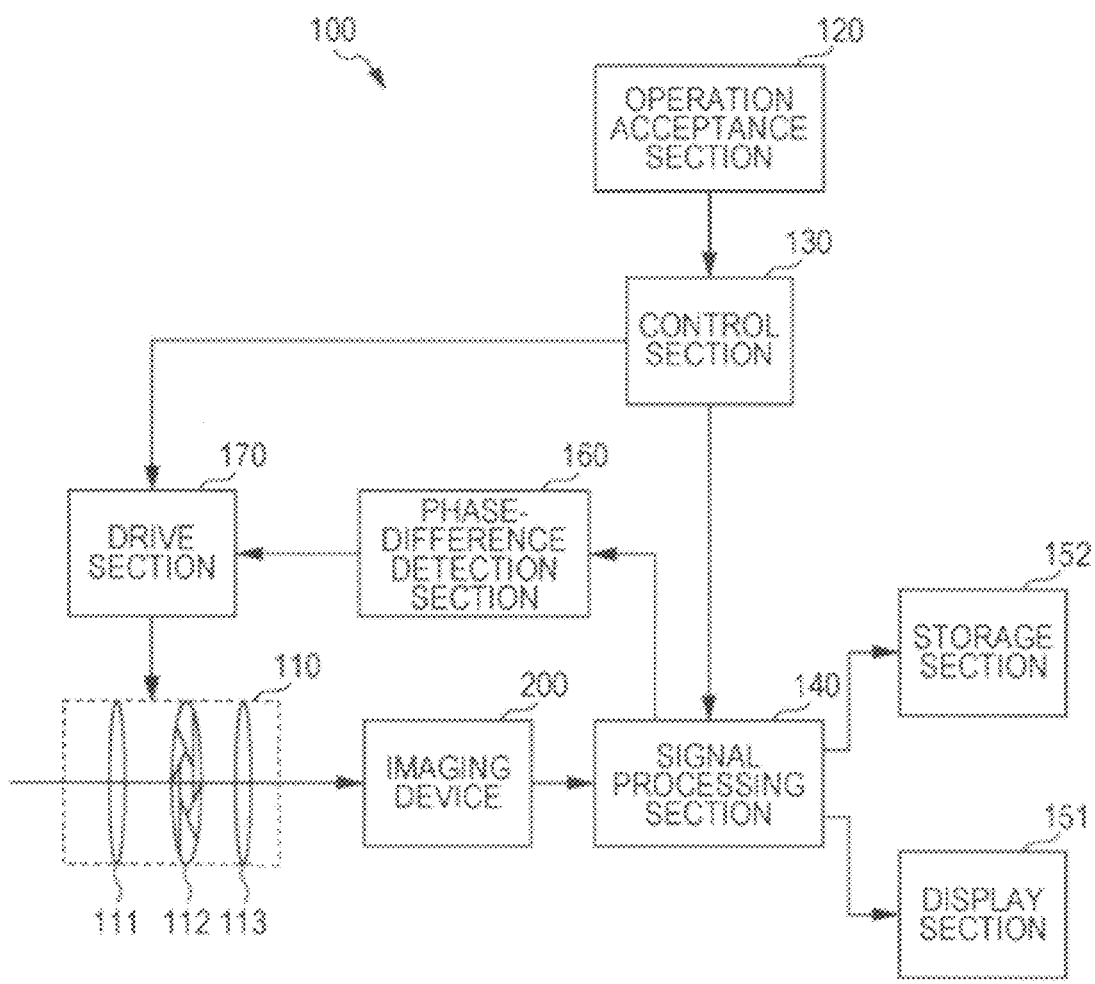
FIG. 1 is a block diagram illustrating an example of a functional configuration of an imaging apparatus according to a first embodiment of the present disclosure.

FIG. 1 is a block diagram illustrating an example of a functional configuration of an imaging apparatus 100 according to a first embodiment of the present disclosure. The imaging apparatus 100 is an imaging apparatus which shoots a subject to generate image data (a captured image), and records the generated image data as an image content (a still image content or a moving image content). In this regard, in the following, an example of recording a still image content (a still image file) is mainly described as an image content (image file).

The imaging apparatus 100 includes a lens section 110, an operation acceptance section 120, a control section 130, an imaging device 200, a signal processing section 140, a display section 151, and a storage section 152. Also, the imaging apparatus 100 includes a phase-difference detection section 160 and a drive section 170.

The lens section 110 condenses light from a subject (subject light). The lens section 110 includes a zoom lens 111, an aperture 112, and a focus lens 113.

The zoom lens 111 is moved in an optical axis direction by being driven by the drive section 170 to change a focal length so as to adjust a magnification of the subject included in the captured image.

The aperture 112 is a shield for adjusting the amount of light of subject light that enters onto the imaging device 200 by a change in a degree of opening driven by the drive section 170.

The focus lens 113 is moved in the optical axis direction by being driven by the drive section 170 in order to adjust focus.

The operation acceptance section 120 accepts operation from the user. For example, when a shutter button (not shown in the figure) is pressed, the operation acceptance section 120 supplies a signal on the pressing to the control section 130 as an operation signal.

The control section 130 controls operation of each section of the imaging apparatus 100. In this regard, in FIG. 1, only major signal lines are illustrated, and the rest of the lines are omitted. For example, when the shutter button is pressed, and the control section 130 receives an operation signal for starting to record a still image, the control section 130 supplies a signal on execution of recording the still image to the signal processing section 140.

The imaging device 200 is an image sensor performing photoelectric conversion on the received subject light to produce an electronic signal. The imaging device 200 is achieved, for example, by an x-y addressing type sensor, such as a CMOS (Complementary Metal Oxide Semiconductor) sensor, etc. On the imaging device 200, pixels (image generation pixels) that generate signals for generating a captured image on the basis of the received subject light and pixels (phase-difference detection pixels) that generate signals for performing phase-difference detection are arranged. Here, the phase-difference detection is a method of detecting a focal point in which light having passed through a taking lens is subjected to pupil dividing to form a pair of images, and an interval of the formed images (the amount of difference among the images) is measured (phase difference is detected) so that a degree of in focus is detected.

Also, a pixel receiving red light (R pixel) using a color filter transmitting red (R) light, and a pixel receiving green light (G pixel) using a color filter transmitting green (G) light are arranged on the imaging device 200 as image generation pixels. Also, in addition to the R pixel and the G pixel, a pixel receiving blue light (B pixel) using a color filter transmitting blue (B) light is arranged on the imaging device 200 as an image generation pixel. Further, a memory (holding section) for performing exposure at the same time without causing an exposure timing difference is connected to each image generation pixel included in the imaging device 200. That is to say, the imaging device 200 is provided with a global shutter function with respect to the image generation pixels. In this regard, a description will be given of the imaging device 200 with reference to FIG. 2. The imaging device 200 supplies an electronic signal (image signal) generated by the photoelectric conversion to the signal processing section 140 for each frame (image data).

The signal processing section 140 performs predetermined signal processing on the electronic signal supplied from the imaging device 200 in order to correct the image signal. The signal processing section 140, for example, converts the electronic signal supplied from the imaging device 200 into digital electronic signal (pixel values), and then performs black level correction, defect correction, shading correction, color mixing correction, etc. The signal processing section 140 supplies the pixel values generated by the phase-difference detection pixels among the pixel values having been subjected to the correction processing to the phase-difference detection section 160.

Also, the signal processing section 140 performs predetermined signal processing on the pixel values generated by the image generation pixels among the pixel values having been subjected to the correction processing, and generates image data to be displayed on the display section 151 or the image data to be stored in the storage section 152. For example, the signal processing section 140 performs white balance correction, gamma correction, mosaic processing, image compression processing, etc. The signal processing section 140 supplies the image data to be displayed on the display section 151 to the display section 151, and displays the image on the display section 151. Also, the signal processing section 140 supplies the image data to be stored in the storage section 152 to the storage section 152, and stores the data into the storage section 152.

The display section 151 displays an image on the basis of the image data supplied from the signal processing section 140. The display section 151 is achieved, for example, by a color liquid-crystal panel.

The storage section 152 records the image data supplied from the signal processing section 140 as an image content (image file). For example, a removable recording medium (one or a plurality of recording media), such as a disc, for example a DVD (Digital Versatile Disk), etc., a semiconductor memory, etc., for example a memory card, etc., can be used for the storage section 152. Also, these recording media may be built in the imaging apparatus 100, or may be detachable from the imaging apparatus 100.

The phase-difference detection section 160 determines whether an object to be in focus (an object to be focused) is in focus or not by the phase-difference detection on the basis of the pixel values of the phase-difference detection pixel supplied from the signal processing section 140. And if in focus, the phase-difference detection section 160 supplies information indicating an in-focus state (in-focus-determination result information) to the drive section 170. Also, if the object to be focused is out of focus, the phase-difference detection section 160 calculates an amount of focus difference (amount of defocus), and supplies information indicating the calculated amount of defocus (for example, a value indicating a number of pixels of the difference) to the drive section 170 as the in-focus-determination result information. In this regard, the phase-difference detection section 160 is an example of the in-focus determination section described in the claims.

The drive section 170 drives the zoom lens 111, the aperture 112, and the focus lens 113. For example, the drive section 170 calculates the amount of drive of the focus lens 113 on the basis of the in-focus-determination result information output from the phase-difference detection section 160, and moves the focus lens 113 in accordance with the calculated amount of drive. If in focus, the drive section 170 maintains the current position of the focus lens 113. Also, if out of focus, the drive section 170 calculates the amount of drive (moving distance) on the basis of the in-focus-determination result information indicating the amount of defocus and the position information of the focus lens 113, and moves the focus lens 113 in accordance with the amount of drive. In this regard, the drive section 170 is an example of the control section described in the claims.

Example of Pixel Arrangement in Imaging Device

Figure 2:
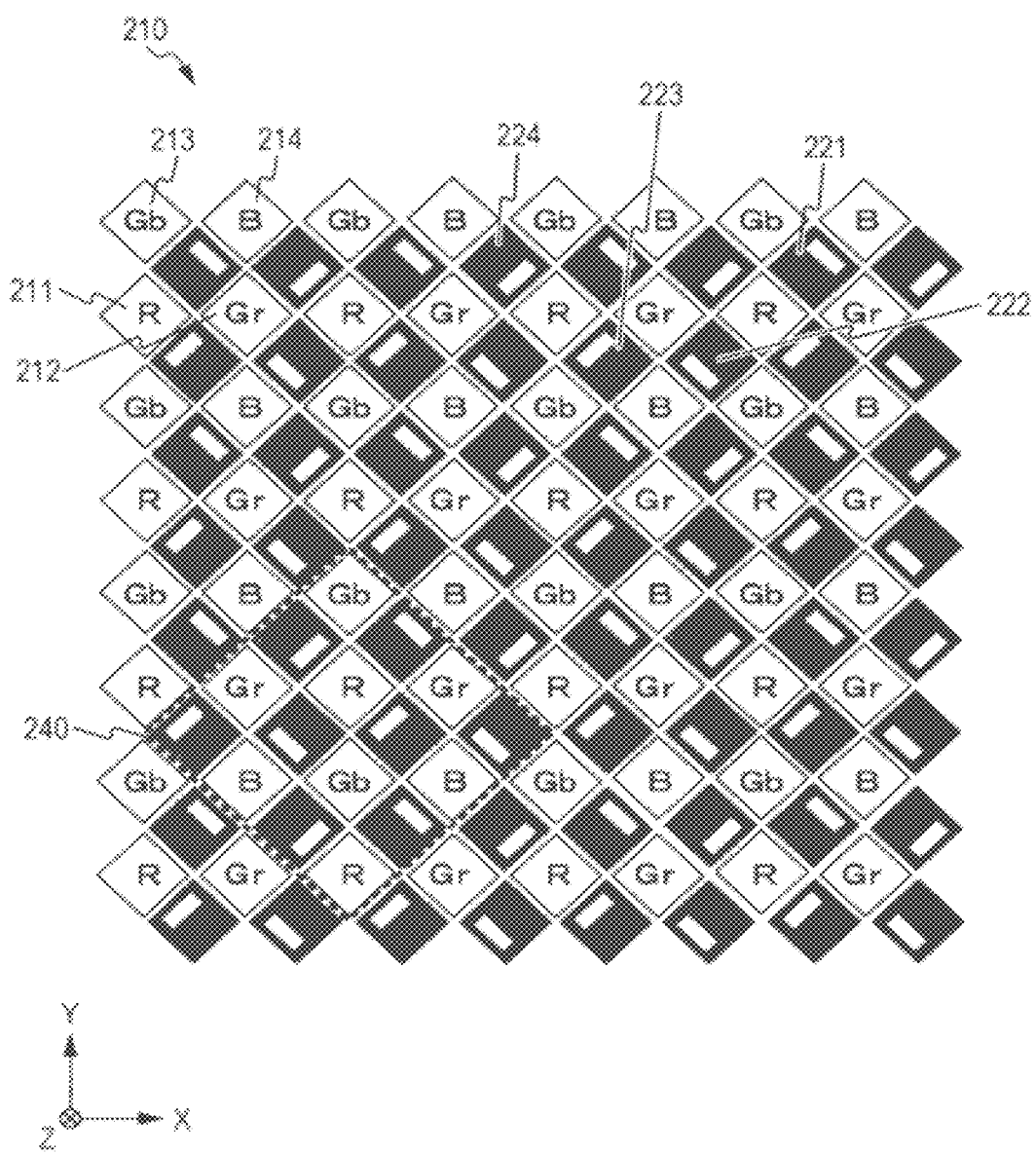
FIG. 2 is a schematic diagram illustrating an example of a pixel arrangement included in an imaging device according to the first embodiment of the present disclosure.

FIG. 2 is a schematic diagram illustrating an example of pixel arrangement included in the imaging device 200 according to the first embodiment of the present disclosure.

In the figure, a description will be given on the assumption of using XY axes, that is to say, on the assumption that an up-and-down direction is a Y-axis, and a left-and-right direction is an X-axis. Also, in the figure, a lower-left corner is assumed to be an origin of the XY axes, an upward direction from the bottom is a plus side of the Y-axis, and a direction from left to right is assumed to be a plus side of the X-axis. In this regard, in the figure, the specific direction in the imaging device 200 (a direction corresponding to the horizontal direction of the captured image (the left-and-right direction)) is assumed to be the X-axis direction, and the orthogonal direction to the specific direction (a direction corresponding to the vertical direction of the captured image (up-and-down direction)) is assumed to be the Y-axis direction. Also, a direction of reading signals in the imaging device 200 is assumed to be the X-axis direction (the signals are read for each line).

In the figure, for the sake of convenience of explanation, a description will be given using a partial-pixel area (area 210) among individual pixels included in the imaging device 200. In this regard, the pixels in the imaging device 200 are arranged in a repetitive pattern of the pixel arrangements corresponding to that area using the pixel arrangement shown by the area 210 as one unit (the pixel arrangement corresponding to the area 210) in the X-axis direction and in the Y-axis direction.

In the figure, one pixel is illustrated by one square having a shape that is rotated 45 degrees relative to the X-axis direction (diagonal square). The image generation pixels are illustrated by diagonal squares including symbols representing color filters (R, G, and B) that are provided, respectively. That is to say, an R pixel of the image generation pixel is illustrated by an R pixel 211 in the figure, and a B pixel of the image generation pixel is illustrated by a B pixel 214 in the figure. Also, for a G pixel, a G pixel in a row (line) including the R pixel (R pixel 211) is denoted by a Gr pixel (Gr pixel 212), and a G pixel in a row (line) including the B pixel (B pixel 214) is denoted by a Gb pixel (Gb pixel 213).

Also, a phase-difference detection pixel is denoted by a gray diagonal square with a white rectangle added. In this regard, the white rectangle in the phase-difference detection pixel denotes a light receiving side of a light receiving element without shielding incident light by a light shielding layer (a side having an opening section in a light shielding layer). Here, a description will be given of the phase-difference detection pixels illustrated in the figure (the phase-difference detection pixels 221 to 224).

The phase-difference detection pixel 221 is a phase-difference detection pixel on which a light shielding layer is formed such that subject light that has passed through an upper-right half of an exit pupil (an upper side of the area divided by line y=−x) is shielded among incident subject light on a microlens of the phase-difference detection pixel 221. That is to say, the phase-difference detection pixel 221 shields subject light that has passed through the upper-right half of the exit pupil, and receives subject light that has passed through a lower-left half of the exit pupil.

The phase-difference detection pixel 222 is a phase-difference detection pixel on which a light shielding layer is formed such that subject light that has passed through a lower-left half of an exit pupil (a lower side of the area divided by line y=−x) is shielded among incident subject light on a microlens of the phase-difference detection pixel 222. That is to say, the phase-difference detection pixel 222 shields subject light that has passed through the lower-left half of the exit pupil, and receives subject light that has passed through an upper-right half of the exit pupil. Also, a pair of images is formed when the phase-difference detection pixel 222 is used with the phase-difference detection pixel 221 as a pair.

The phase-difference detection pixel 223 is a phase-difference detection pixel on which a light shielding layer is formed such that subject light that has passed through an upper-left half of an exit pupil (an upper side of the area divided by line y=x) is shielded among incident subject light on a microlens of the phase-difference detection pixel 223. That is to say, the phase-difference detection pixel 223 shields subject light that has passed through the upper-left half of the exit pupil, and receives subject light that has passed through a lower-right half of the exit pupil.

The phase-difference detection pixel 224 is a phase-difference detection pixel on which a light shielding layer is formed such that subject light that has passed through a lower-right half of an exit pupil (a lower side of the area divided by line y=x) is shielded among incident subject light on a microlens of the phase-difference detection pixel 224. That is to say, the phase-difference detection pixel 224 shields subject light that has passed through the lower-right half of the exit pupil, and receives subject light that has passed through an upper-left half of the exit pupil. Also, a pair of images is formed when the phase-difference detection pixel 224 is used with the phase-difference detection pixel 223 as a pair.

Here, a description will be given of the pixel arrangement in the imaging device 200.

In the imaging device 200, the image generation pixels and the phase-difference detection pixels are arranged in a lattice form in a diagonal direction (diagonal lattice) (in the embodiment of the present disclosure, called a diagonal pixel array). Also, in the imaging device 200, a row (line) on which image generation pixels are disposed and a row (line) on which phase-difference detection pixels are disposed are alternately arranged in an orthogonal direction to a reading direction (assumed to be a column direction in the first embodiment of the present disclosure). That is to say, as shown in FIG. 2, a line of image generation pixels, a line of phase-difference detection pixels, a line of image generation pixels, and a line of phase-difference detection pixels . . . are alternately disposed in the Y-axis direction. Further, the image generation pixels and the phase-difference detection pixels are alternately disposed so as to be partly overlapped (substantially each half pixel). In this regard, the pixel arrangement in the imaging device 200 is a diagonal pixel array, and thus a column in which the image generation pixels are disposed and a column in which the phase-difference detection pixels are disposed are alternately arranged such that the image generation pixels and the phase-difference detection pixels are overlapped with each other for each half pixel in the column direction (X-axis direction) too.

Also, in the imaging device 200, a line in which the phase-difference detection pixel 221 and the phase-difference detection pixel 224 are disposed, and a line in which the phase-difference detection pixel 222 and the phase-difference detection pixel 223 are disposed are arranged so as to alternately sandwich a row of the image generation pixels. And the phase-difference detection pixel 221 and the phase-difference detection pixel 222 are disposed in one line (line y=x) directed from lower left to upper right, and the phase-difference detection pixel 223 and the phase-difference detection pixel 224 are disposed in one line (line y=−x) directed from lower right to upper left. That is to say, a pair of the phase-difference detection pixels is disposed in one diagonal line.

Also, in the imaging device 200, a Bayer array is formed by the disposition of only the image generation pixels when lines in which the phase-difference detection pixels are disposed are excluded. Further, in the disposition of only the image generation pixels, intervals of the image generation pixels in the row direction (the X-axis direction) and the column direction (the Y-axis direction) become identical with each other. That is to say, in the imaging device 200, although both the phase-difference detection pixels and the image generation pixels are arranged, distances of the image generation pixels in the row direction and in the column direction become uniform, and the image generation pixels are arranged in a Bayer array. Thereby, it becomes not necessary to complement image data corresponding to a position of the phase-difference detection pixel.

In this regard, in the imaging device 200, a memory for a global shutter function of the image generation pixel is disposed under a shielded area of the phase-difference detection pixel (a shielded area from subject light). Thus, a description will be given of the memory (holding section) disposed under the shielded area of the phase-difference detection pixel by giving attention to pixels included in an area 240 illustrated in the figure with reference to FIG. 3.

Figure 3:
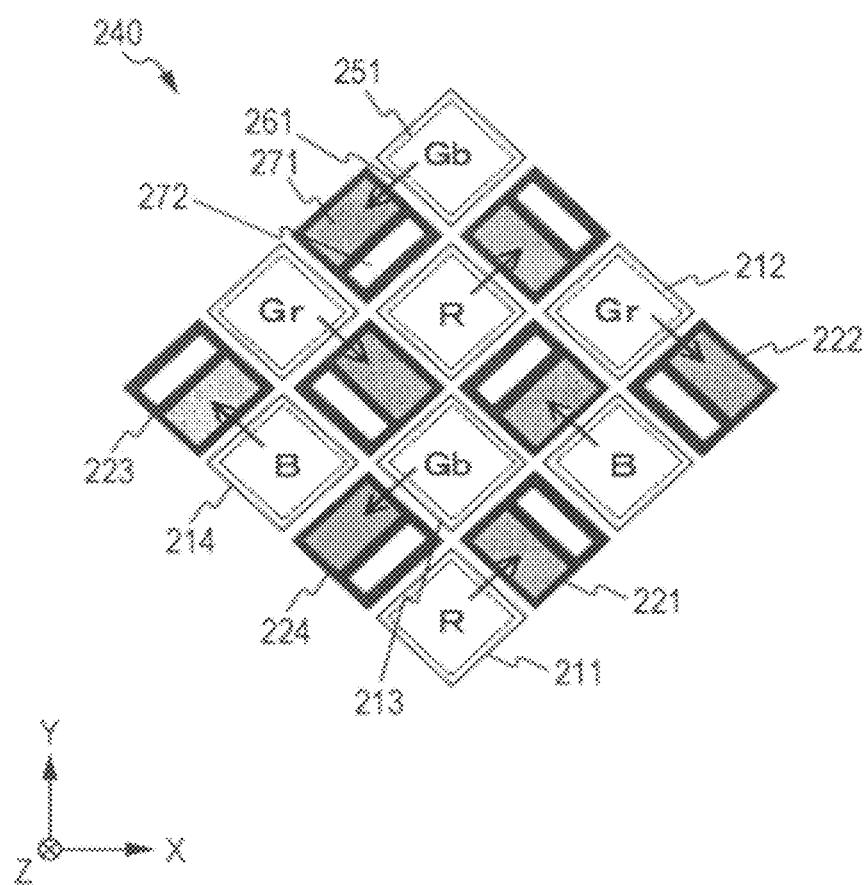
FIG. 3 is a top view illustrating an arrangement of image generation pixels and phase-difference detection pixels in an area of the imaging device according to the first embodiment of the present disclosure.

Example of Arrangement of Image Generation Pixels and Phase-Difference Detection Pixels FIG. 3 is a top view illustrating an arrangement of the image generation pixels and the phase-difference detection pixels in the area 240 of the imaging device 200 according to the first embodiment of the present disclosure. In this regard, XY-axes are assumed, that is to say, it is assumed that the right-and-left direction is an X-axis, and the up-and-down direction is a Y-axis in the figure.

In the figure, the arrangement of the image generation pixels and the phase-difference detection pixels in the area 240 illustrated in the area 210 in FIG. 2 is illustrated together with, light receiving elements (light receiving elements 251 and 272) of each pixel and a memory (memory 271) disposed in the image generation pixel. Also, in the figure, a connection relationship between a light receiving element (light receiving element 251) of the image generation pixel and a memory (memory 271) to which the light receiving element 251 is connected is denoted by an arrow (arrow 261) indicating a flow of an electronic signal (charge).

The light receiving elements 251 and 272 converts received light into an electronic signal (stores charge in accordance with the amount of light) so as to generate an electronic signal having an intensity in accordance with the amount of the received light. The light receiving elements 251 and 272 include, for example, a photo diode (PD). In this regard, the light receiving element 251 is a light receiving element of an image generation pixel, and the light receiving element 272 is a light receiving element of a phase-difference detection pixel.

Also, the light receiving element 251 is disposed such that an area of the light receiving surface is as large as possible in order to receive light condensed by a microlens of each image generation pixel without loss. On the other hand, the light receiving element 272 ought to receive subject light that is not shielded by a light shielding layer, and thus the light receiving element 272 having a size corresponding to an area receiving subject light that is not shielded is disposed.

The memory 271 temporarily stores charge stored by the light receiving element 251 in an exposure period (exposure timing). The memory 271 is disposed in an area (shielded area) shielded from subject light by the light shielding layer of the phase-difference detection pixel. Also, the memory 271 is connected to the light receiving element of one image generation pixel out of the image generation pixels adjacent to the phase-difference detection pixel in which the memory 271 is disposed, and receives the charge stored in the light receiving element at the end of a exposure period, and temporarily holds the charge. And when signals are read in the imaging device 200, the charge held by the memory 271 connected to each image generation pixel is read in sequence. In this regard, transfer operation of charge from the light receiving element to the holding section at the end of the exposure period is performed at the same time by all the image generation pixels in the imaging device 200. That is to say, charge is transferred from all the image generation pixels to the memory 271 at the same time, and thereby a global shutter function is achieved.

In this regard, as shown by the arrow 261, the phase-difference detection pixels are disposed such that phase-difference detection (arrangement allowing formation of a pair of images) is allowed, and there is no image generation pixel that is not connected to the memory 271.

Figure 4A:
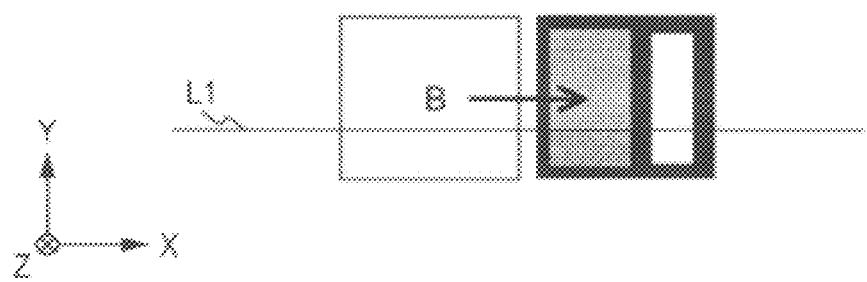
FIG. 4A and FIG. 4B are schematic diagrams illustrating a top configuration and a cross-sectional configuration, respectively, of the image generation pixel and the phase-difference detection pixel according to the first embodiment of the present disclosure.
Figure 4B:
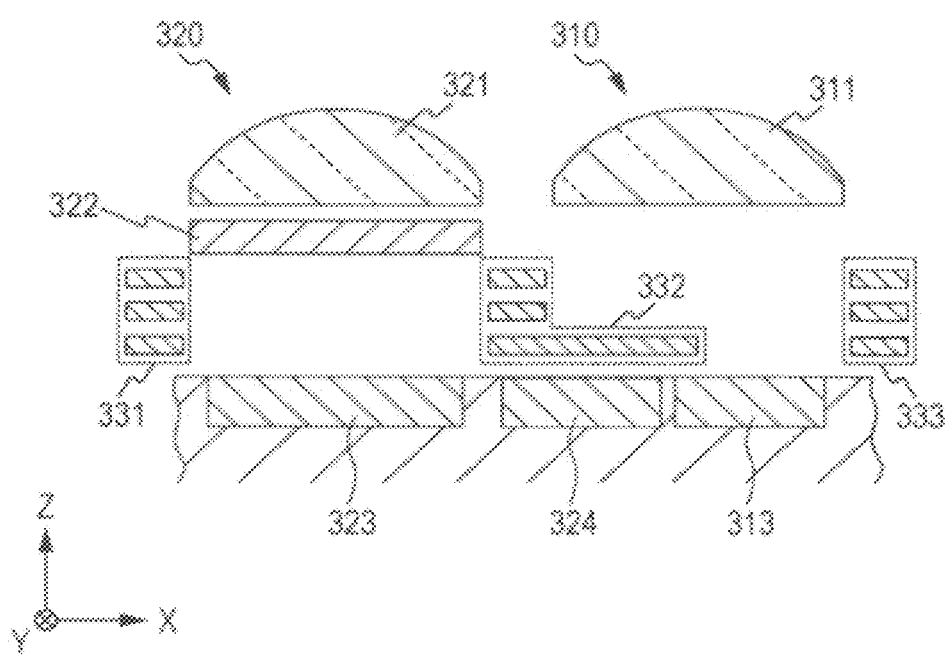

Example of Cross-Sectional Configurations of Image Generation Pixel and Phase-Difference Detection Pixel FIG. 4A and FIG. 4B are schematic diagrams illustrating a top configuration and a cross-sectional configuration, respectively, of the image generation pixel and the phase-difference detection pixel according to the first embodiment of the present disclosure.

In this regard, as shown in FIG. 4A, a description will be given on the assumption that the phase-difference detection pixel having the shielded side on the left and the opening section on the right, and the B pixel are disposed adjacent to each other on the right and the left (the phase-difference detection pixel is on the right, and the B pixel is on the left). Also, it is assumed that the memory of the phase-difference detection pixel and the light receiving element of the B pixel are connected.

FIG. 4B illustrates a cross-sectional configuration taken along line L1 shown in FIG. 4A. In FIG. 4B, microlenses (microlenses 321 and 311) of the B pixel 320 and the phase-difference detection pixel 310, and light receiving elements (a light receiving element 323 and a light receiving element 313) of the B pixel 320 and the phase-difference detection pixel 310, respectively, are illustrated. Also, in FIG. 4B, a memory (memory 324) connected to the light receiving element (light receiving element 323) of the B pixel 320 and wires (wires 331, 332 and 333) disposed on edges of the B pixel 320 and the phase-difference detection pixel 310 are illustrated. In this regard, the phase-difference detection pixel 310 is assumed not to include a color filter.

The microlens 321 is a lens for condensing subject light onto the light receiving element 323. Also, the microlens 311 is a lens for condensing subject light onto the light receiving element 313.

The light receiving elements 323 and 313 convert received light into an electronic signal (photoelectric conversion) so as to generate an electronic signal having an intensity in accordance with the amount of received light. In this regard, the light receiving element 323 is a cross-sectional configuration of the light receiving element 251 shown in FIG. 3, and the light receiving element 313 is a cross-sectional configuration of the light receiving element 272 shown in FIG. 3, and thus descriptions thereof will be omitted here.

The wires 331, 332 and 333 are wires for connecting individual circuits in the image generation pixel and the phase-difference detection pixel. Also, the wires 331, 332 and 333 are made of metal, and thus function as light shielding layers shielding subject light. In FIG. 4B, the wires 331, 332 and 333 are illustrated such that the three wires are disposed in layers with respect to the optical axis.

Also, the wire 332 is provided with one wire protruding around the center of the phase-difference detection pixel 310. This protruding portion shields the subject light that has passed through a right half of the exit pupil between the light receiving element 313 and the microlens 311. On the other hand, the subject light that has passed through a left half of the exit pupil passes a portion between the protruding portion and the wire 333 (the opening section of the light shielding layer), and is received by the light receiving element 313.

The memory 324 temporarily holds charge having stored by the light receiving element 323 in an exposure period. In this regard, the memory 324 has a cross-sectional configuration of the memory 271 shown in FIG. 3, and thus a description thereof will be omitted here. As shown in FIG. 4B, the memory 324 is disposed in an area (shielded area) shielded from subject light by the protruding portion of the protruding wire 332. Also, the memory 324 is close to the light receiving element (light receiving element 323) to which the memory 324 is connected (in order to make it easy to connect).

As shown in FIG. 4B, the memory (memory 324) for a global shutter function of the image generation pixel is disposed in the shielded area of the phase-difference detection pixel 310, and thus it is possible to enlarge the light receiving area of the light receiving element (light receiving element 323) of the image generation pixel.

Here, descriptions will be given of the phase-difference detection pixels 221 to 224 disposed in the imaging device 200. The phase-difference detection pixels 221 and 223 have substantially the same cross-sectional configurations as that illustrated in FIG. 4B, although cross-sectional directions are different in the cross-sectional configuration. That is to say, memories are disposed between the light receiving element of the image generation pixel to which the memories are connected, and the light receiving elements of the phase-difference detection pixels 221 and 223, respectively.

Also, in the case of the phase-difference detection pixels 222 and 224, a positional relationship between the image generation pixels connected to the memory and the phase-difference detection pixel is different from that in FIG. 4B. In the phase-difference detection pixels 222 and 224, the light receiving elements of the image generation pixel connected to the memory and one end of the memory in the longitudinal direction are adjacent to each other. However, the configurations are the same as that in FIG. 4B in the point that a memory is disposed under the wire 332 having the large protruding portion, and that the light receiving element connected to the memory is adjacent to the memory. Accordingly, descriptions of the individual cross-sectional configurations of the phase-difference detection pixels 221 to 224 will be omitted.

Figure 5A:
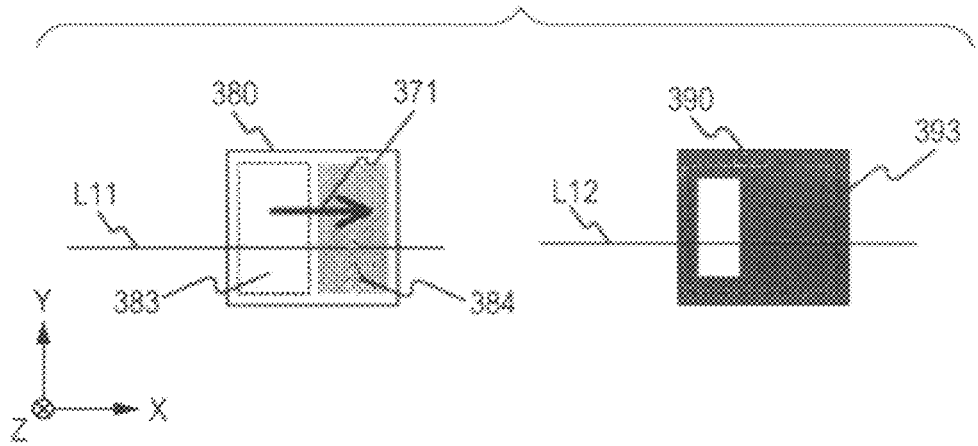
FIG. 5A and FIG. 5B are schematic diagrams illustrating top configurations and cross-sectional configurations, respectively, of a general image generation pixel and a general phase-difference detection pixel provided with a memory for a global shutter function.
Figure 5B:
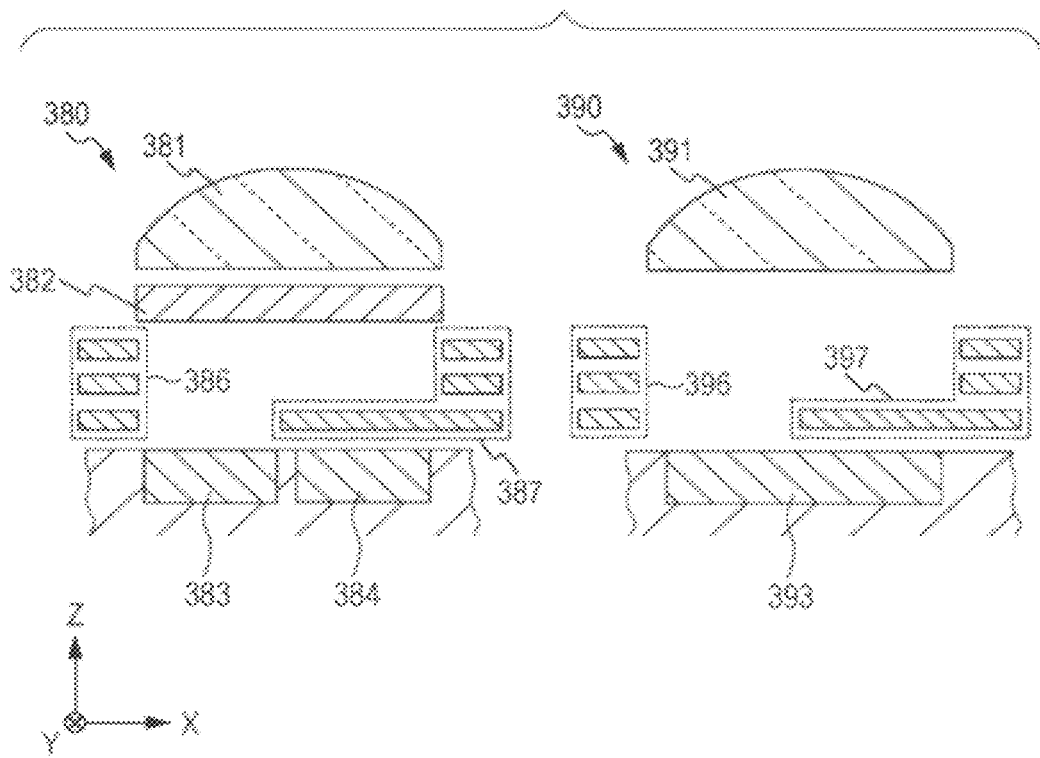

Example of Cross-Sectional Configurations of General Image Generation Pixel Provided with Memory FIG. 5A and FIG. 5B are schematic diagrams illustrating top configurations and cross-sectional configurations of a general image generation pixel and a general phase-difference detection pixel provided with a memory for a global shutter function.

FIG. 5A is a top view illustrating the general image generation pixel provided with the memory for the global shutter function and the general phase-difference detection pixel. In this regard, in FIG. 5A, for the sake of convenience of explanation, it is assumed that the image generation pixel and the phase-difference detection pixel are square pixels having one side parallel to the X-axis.

FIG. 5A illustrates an image generation pixel (image generation pixel 380) provided with a memory for a global shutter function, and a general phase-difference detection pixel (phase-difference detection pixel 390). In the image generation pixel 380, a dotted-line frame (light receiving element 383) including a light receiving element of the image generation pixel 380 denoted by a white area, and a netted area (memory 384) denoting a memory of the image generation pixel 380 are illustrated. Further, in the image generation pixel 380, a connection relationship between the light receiving element 383 and the memory 384 is illustrated by an arrow (arrow 371) denoting a flow of charge. Also, in the phase-difference detection pixel 390, a light receiving element of the phase-difference detection pixel 390 is denoted by a dotted-line frame (light receiving element 393).

As shown in FIG. 5A, in a general image generation pixel including a memory, the light receiving element 383 and the memory 384 share an area of each image generation pixel. That is to say, by providing the image generation pixel with a memory for a global shutter function, an area of the light receiving surface of the light receiving element 383 decreases. Thereby, a decrease occurs in the amount of light received by the light receiving element, and a decrease occurs in the amount of charge that can be stored in the light receiving element 383. This results in deterioration of image quality of the captured image.

Next, a description will be given of the cross-sectional configurations of a general image generation pixel provided with a memory for a global shutter function and a general phase-difference detection pixel, respectively, with reference to FIG. 5B.

In this regard, FIG. 5B illustrates a cross-sectional configuration taken along the X-axis direction line (line L11) of the image generation pixel 380. Also, FIG. 5B illustrates a cross-sectional configuration taken along the X-axis direction line (line L12) of the phase-difference detection pixel 390.

FIG. 5B illustrates a microlens 381, a color filter 382, a light receiving element 383, a memory 384, and wires 386 and 387 as a cross-sectional configuration of the image generation pixel 380. Also, FIG. 5B illustrates a microlens 391, a light receiving element 393, and wires 396 and 397 as a cross-sectional configuration of the phase-difference detection pixel 390. In this regard, it is assumed that the phase-difference detection pixel 390 is not provided with a color filter.

The microlens 381 and 391 and the light receiving elements 383 and 393 are the same as the microlens and the light receiving elements shown in FIG. 4, and thus descriptions thereof will be omitted.

The wires 386, 387, 396 and 397 are wires for connecting individual circuits in the image generation pixel and in the phase-difference detection pixel in the same manner as the wires shown in FIG. 4.

The wire 387 is provided with one wire protruding around the center of the image generation pixel 380 in order to prevent light from irradiating on the memory 384 of the image generation pixel 380. If the memory 384 is exposed to subject light, photoelectric conversion occurs in the memory 384, and charge is stored, and thus the protruding wire shields the memory 384 in order to prevent subject light from irradiating on the memory 384.

The memory 384 temporarily holds charge having been stored by the light receiving element 383 in an exposure period in the same manner as the memory 324 shown in FIG. 4. Also, the memory 384 is formed on the same surface of the light receiving element 383 in the area shielded by the wire 387 out of the area of the image generation pixel 380.

Also, one half of the light receiving element (light receiving element 393) of the phase-difference detection pixel 390 is covered by the light shielding layer. That is to say, the light receiving element having the same size as that of a general image generation pixel not provided with a memory for a global shutter function is disposed in the general phase-difference detection pixel 390.

As shown in FIG. 5B, in a general image generation pixel provided with a memory for a global shutter function, the area of the light receiving surface of the light receiving element 383 drastically decreases compared with the case of not including a memory. On the other hand, as shown in FIG. 4B, in the image generation pixel according to the first embodiment of the present disclosure, the memory of the image generation pixel for the global shutter function is disposed under the light shielding layer of the phase-difference detection pixel. Accordingly, in the image generation pixel according to the first embodiment of the present disclosure, it is possible to make the area of the light receiving element of the image generation pixel identical to that of the case of not providing a memory.

Figure 6:
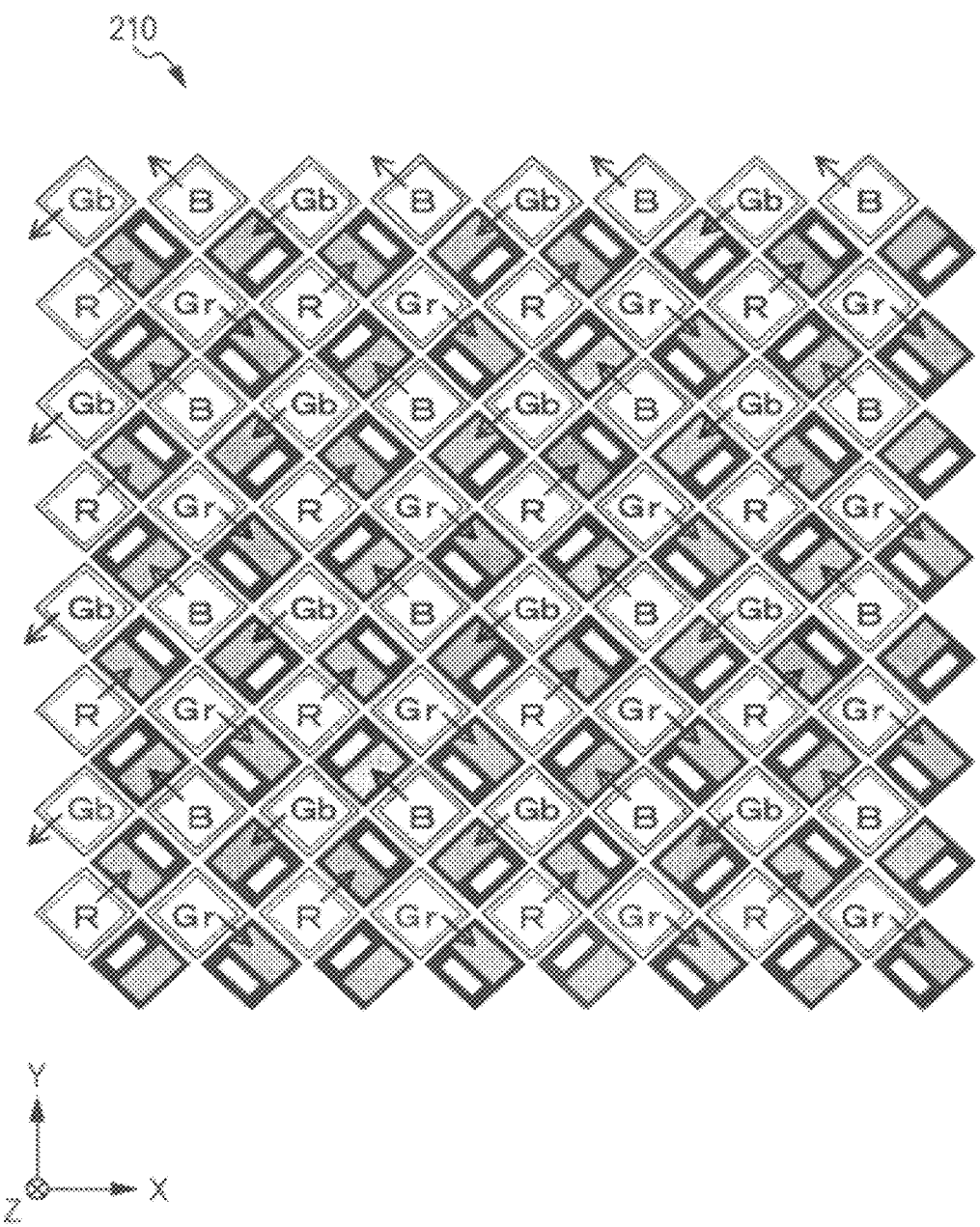
FIG. 6 is a schematic diagram illustrating connections between the image generation pixels and memories disposed in the phase-difference detection pixels in the imaging device according to the first embodiment of the present disclosure using the pixel arrangement illustrated in FIG. 2.

An Example of Connection Between Image Generation Pixel and Memory Disposed in the Phase-Difference Detection Pixel FIG. 6 is a schematic diagram illustrating connections between the image generation pixels and memories disposed in the phase-difference detection pixels in the imaging device 200 according to the first embodiment of the present disclosure using the pixel arrangement illustrated in FIG. 2.

In this regard, FIG. 6 illustrates the area 210 shown in FIG. 2, in which the area 240 is illustrated in FIG. 3, and thus a detailed description thereof will be omitted here.

As shown in FIG. 6, a row (line) in which the image generation pixels are disposed and a row (line) in which the phase-difference detection pixels are disposed, and thereby a plurality of the phase-difference detection pixels are adjacent to the image generation pixel. Accordingly, it becomes easy to dispose a memory to which a light receiving element of the image generation pixel is connected. Also, the phase-difference detection pixel performing pupil dividing in a diagonal direction is disposed, and a rectangular memory and a light receiving element are disposed with one side thereof directed in a diagonal direction in the phase-difference detection pixel, making it possible to use the area of the phase-difference detection pixel. Further, a phase-difference detection pixel performing pupil dividing in a diagonal direction is provided, and a rectangular memory is disposed. Accordingly, it is possible to shorten a distance between the light receiving element of the image generation pixel and the memory connected to the light receiving element.

In this manner, by the first embodiment of the present disclosure, a holding section for a global shutter function of the image generation pixel is disposed in a shielded area of the phase-difference detection pixel so that it is possible to reduce a decrease in the area of the light receiving element in the image generation pixel. That is to say, by the first embodiment of the present disclosure, it is possible to reduce deterioration of image quality of an image generated by an imaging device having a global shutter function.

2. Second Embodiment of the Present Disclosure

A description has been given of an example in which only an image generation pixel is connected to a memory disposed in the shielded area of the phase-difference detection pixel in the first embodiment of the present disclosure. Thereby, for the image signal generated by the image generation pixel, a phenomenon in which an image of a moving body is distorted at the time of shooting the moving body (focal plane phenomenon) is relieved.

However, the phase-difference detection pixel is not connected to the memory, and thus the image of a moving body is distorted when the moving body is shot. By the distortion of the image generated by an image signal of the phase-difference detection pixel, it is assumed that precision of in-focus determination in the phase-difference detection section 160 becomes deteriorated.

Thus, in a second embodiment of the present disclosure, a description will be given of a case of the imaging device in which a light receiving element of the phase-difference detection pixel is also connected to a memory with reference to FIG. 7.

Figure 7:
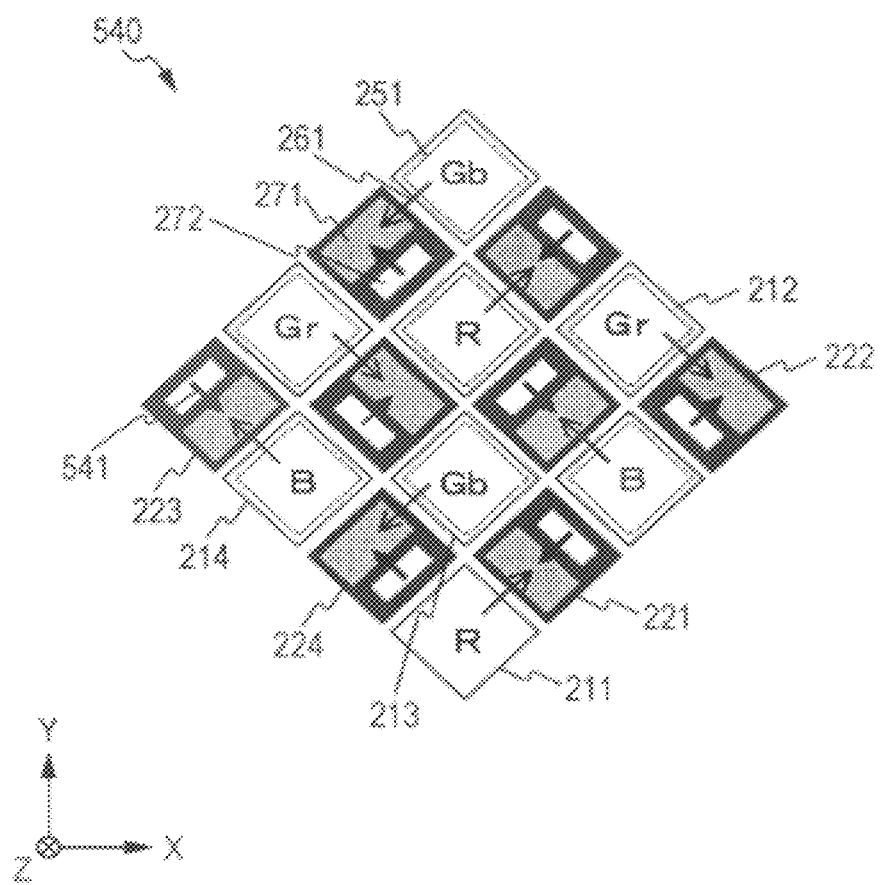
FIG. 7 is a top view illustrating an arrangement of image generation pixels and phase-difference detection pixels in an area of an imaging device according to a second embodiment of the present disclosure.

Example of Arrangement of Image Generation Pixels and Phase-Difference Detection Pixels FIG. 7 is a top view illustrating an arrangement of image generation pixels and phase-difference detection pixels in an area (area 540) of an imaging device according to a second embodiment of the present disclosure. In this regard, FIG. 7 is a variation of FIG. 3, and is different only in the point that charge is transferred from the light receiving element of the phase-difference detection pixel to the memory. Accordingly, a same symbol is given to a same element, and a description thereof will be omitted here.

In FIG. 7, an arrow (arrow 541) indicating charge transfer from the phase-difference detection pixel to the memory is illustrated. As shown by the arrow 541, the light receiving element (light receiving element 272) of the phase-difference detection pixel is connected to a memory (memory 271) disposed at a position of the light shielding layer of each phase-difference detection pixel. That is to say, a light receiving element of one pixel out of four image generation pixels adjacent to the phase-difference detection pixel in which the memory 271 is disposed and the light receiving element of the phase-difference detection pixel in which the memory 271 is disposed are connected to the memory 271.

Here, a description will be given of operation of the imaging apparatus in the case where both the light receiving element of the image generation pixel and the light receiving element of the phase-difference detection pixel are connected to the memory 271. In an imaging device according to the second embodiment of the present disclosure, the light receiving element of the image generation pixel and the light receiving element of the phase-difference detection pixel are connected to one memory. That is to say, when a signal is read through the memory (at the time of carrying out a global shutter), it is difficult to read either an image-generation pixel signal or a phase-difference detection pixel signal in a reading period of one frame. Accordingly, in the second embodiment of the present disclosure, a frame period in which only a signal of the image generation pixel is read, and a frame period in which only a signal of the phase-difference detection pixel is read are alternately repeated.

In this manner, by the second embodiment of the present disclosure, a global shutter function is achieved in reading a signal of the phase-difference detection pixel, and thereby it is possible to improve precision of in-focus determination.

3. Variations

Descriptions have been given of examples in which square pixels rotated 45 degrees with respect to the X-axis direction are disposed in a lattice form (diagonal lattice arrangement), and further a line of an image generation pixel and a line of a phase-difference detection pixel are alternately disposed in the first and the second embodiments of the present disclosure. However, the present disclosure is not limited to this, and can be applied to pixels having various shapes and various arrangements.

Thus, a description will be given of an example of the case where a pixel is square-shaped and not rotated (square lattice arrangement) with reference to FIG. 8.

Also, descriptions will be given of examples of diagonal lattice arrangements that are different from the first and the second embodiments of the present disclosure with reference to FIG. 9A to FIG. 11.

Example of Pixel Arrangement in Imaging Device

Figure 8:
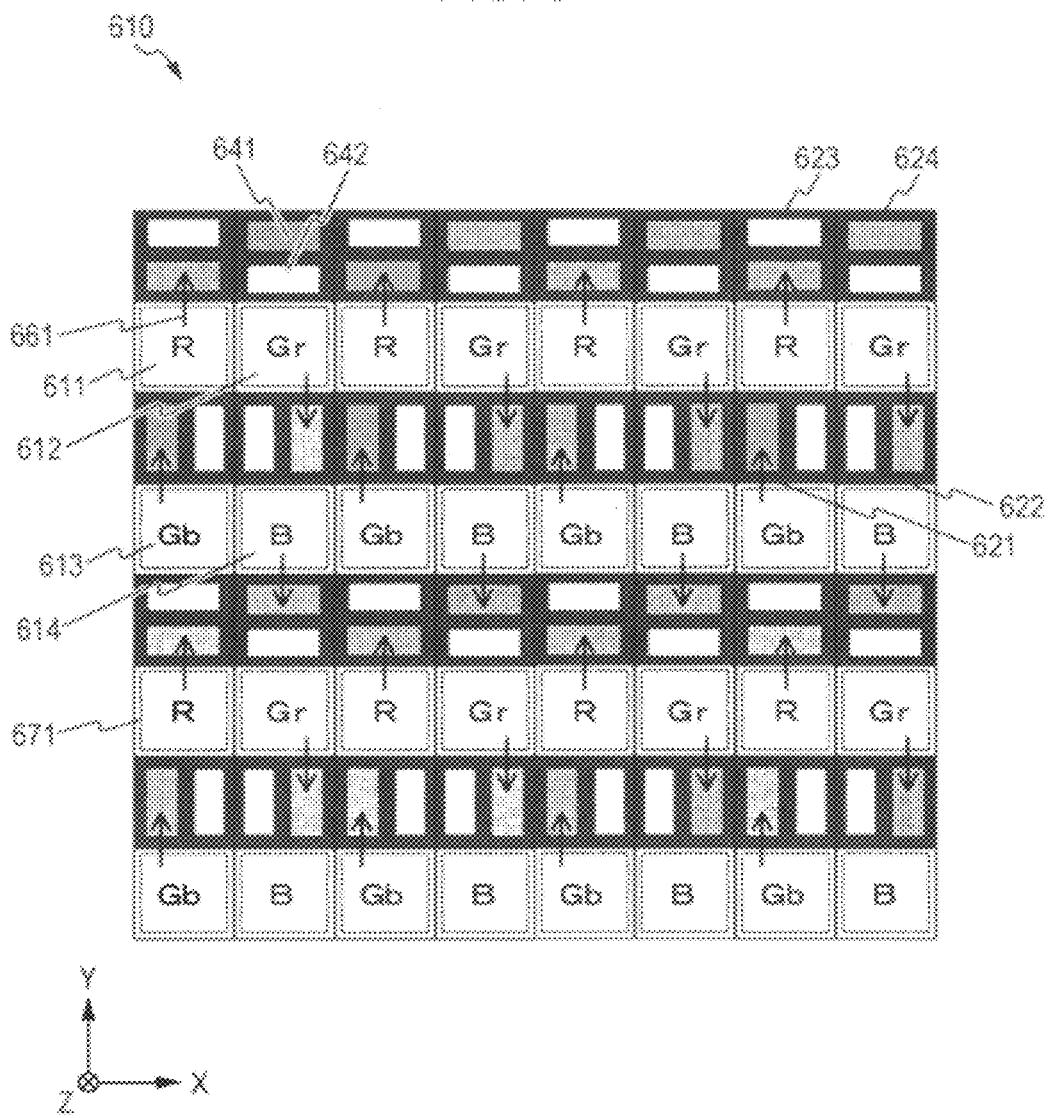
FIG. 8 is a schematic diagram illustrating an example of a pixel arrangement of an imaging device in which square pixels are arranged in a lattice form as a first variation of the first embodiment of the present disclosure.

FIG. 8 is a schematic diagram illustrating an example of a pixel arrangement of an imaging device in which square pixels are arranged in a lattice form as a first variation of the first embodiment of the present disclosure.

In FIG. 8, for the sake of convenience of description, a description will be given using an area (area 610) of partial pixels (pixels of 8 rows×8 columns) among individual pixels included in the imaging device. In this regard, the pixel arrangement in the imaging device is an arrangement in which using the pixel arrangement shown by the area 610 as one unit, a pixel arrangement corresponding to the unit (a pixel arrangement corresponding to the area 610) is repeated in the X-axis direction and in the Y-axis direction.

In the same manner as the first embodiment of the present disclosure, in the area 610, a row in which image generation pixels are disposed and a row in which phase-difference detection pixels are disposed are alternately disposed. When rows in which the phase-difference detection pixels are disposed are excluded, the row in which B pixels and G pixels are disposed and the rows in which R pixels and G pixels are disposed are alternately disposed, and thus image generation pixels (R pixel 611, Gr pixel 612, Gb pixel 613, and B pixel 614) form a Bayer array.

Also, in the phase-difference detection pixels (phase-difference detection pixels 621 to 624), a white area denoting a light receiving element (light receiving element 642) and a netted area denoting a memory (memory 641) are illustrated.

The phase-difference detection pixel 621 is a phase-difference detection pixel on which a light shielding layer is formed such that subject light that has passed through a right half of an exit pupil is shielded among incident subject light on a microlens of the phase-difference detection pixel 621. That is to say, the phase-difference detection pixel 621 shields right-half light among the pupil-divided light on the right and the left of the exit pupil (+ and − side in the X-axis direction), and receives light that is a left half of the pupil-divided light.

The phase-difference detection pixel 622 is a phase-difference detection pixel on which a light shielding layer is formed such that subject light that has passed through a left half of an exit pupil is shielded among incident subject light on a microlens of the phase-difference detection pixel 622. That is to say, the phase-difference detection pixel 622 shields left-half light among the pupil-divided light on the right and the left of the exit pupil (+ and − side in the X-axis direction), and receives light that is right half of the pupil-divided light. Also, a pair of images is formed when the phase-difference detection pixel 622 is used with the phase-difference detection pixel 621 as a pair.

The phase-difference detection pixel 623 is a phase-difference detection pixel on which a light shielding layer is formed such that subject light that has passed through an upper half of an exit pupil is shielded among incident subject light on a microlens of the phase-difference detection pixel 623. That is to say, the phase-difference detection pixel 623 shields upper-half light among the pupil-divided light on the up and down of the exit pupil (+ and − side in the Y-axis direction), and receives light that is lower half of the pupil-divided light.

The phase-difference detection pixel 624 is a phase-difference detection pixel on which a light shielding layer is formed such that subject light that has passed through a lower half of an exit pupil is shielded among incident subject light on a microlens of the phase-difference detection pixel 624. That is to say, the phase-difference detection pixel 624 shields upper-half light among the pupil-divided light on the up and down of the exit pupil (+ and − side in the Y-axis direction), and receives light that is the lower half of the pupil-divided light. Also, a pair of images is formed when the phase-difference detection pixel 624 is used with the phase-difference detection pixel 623 as a pair.

Also, in FIG. 8, a connection relationship between a light receiving element (light receiving element 671) of each image generation pixel and a memory (memory 641) to which the light receiving element 671 is connected is denoted by an arrow (arrow 661) indicating a flow of charge (image signal).

As shown in FIG. 8, in the area 610, square pixels are arranged in a lattice form (square lattice arrangement), and a row in which image generation pixels are disposed and a row in which phase-difference detection pixels are disposed are alternately disposed. And the image generation pixels and the phase-difference detection pixels are disposed such that a column in which the image generation pixels are connected to memories of the phase-difference detection pixel disposed thereon, and a column in which the image generation pixels are connected to memories of the phase-difference detection pixels disposed thereunder are alternately disposed.

As shown in FIG. 8, in the imaging device in which square pixels are disposed in a lattice form, it is possible to dispose a holding section for a global shutter function of an image generation pixel in a shielded area of a phase-difference detection pixel.

Figure 9A:
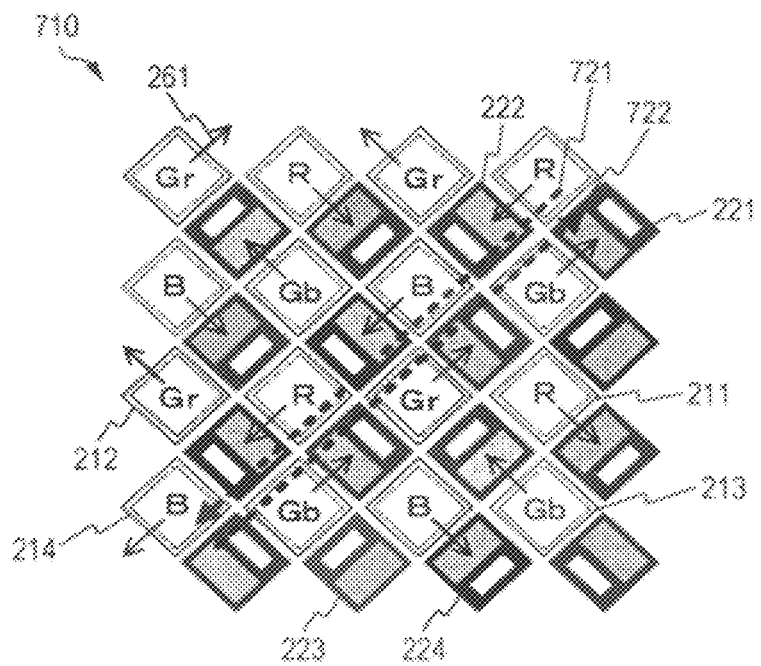
FIG. 9A and FIG. 9B are schematic diagrams illustrating an example of a pixel arrangement in which a light receiving element of an image generation pixel is connected only to a long side of a memory (one end in the lateral direction) as a second variation of the first embodiment of the present disclosure.
Figure 9B:
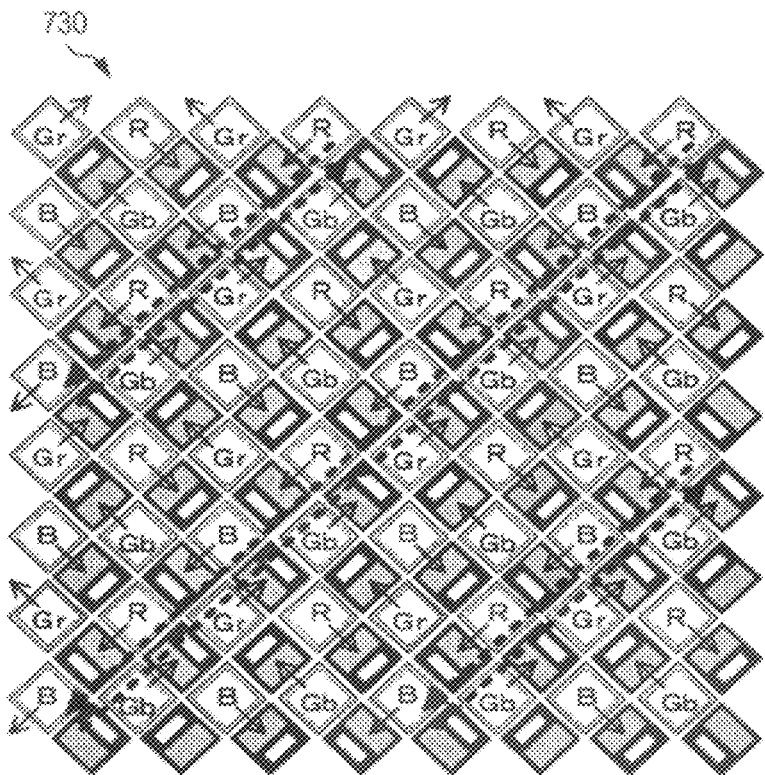

FIG. 9A and FIG. 9B are schematic diagrams illustrating an example of a pixel arrangement in which a light receiving element of an image generation pixel is connected only to a long side of a memory (one end in the lateral direction) as a second variation of the first embodiment of the present disclosure.

FIG. 9A is a top view illustrating an arrangement of image generation pixels and phase-difference detection pixels in a partial pixel area (area 710) out of the imaging device in which a light receiving element of an image generation pixel is connected only to a long side of a memory (one end in the lateral direction).

In this regard, FIG. 9A is a figure corresponding to FIG. 3. Although a number of pixels, an arrangement pattern of phase-difference detection pixels, and a disposition position of a memory to which a light receiving element of an image generation pixel is connected, etc., are different, FIG. 9A illustrates a pixel arrangement in the same manner as FIG. 3. Accordingly, a same symbol is given to a same element, and a description thereof will be omitted here.

In FIG. 9A, a broken-line arrow (arrow 721) denoting a diagonal line, in which phase-difference detection pixels 222 are arranged in series, and a broken-line arrow (arrow 722) denoting a diagonal line, in which phase-difference detection pixels 221 are arranged in series, are illustrated.

Here, a description will be given of the pixel arrangement of this variation. In the arrangement shown in the area 710, a light receiving element of all the image generation pixels is adjacent to a long side of the corresponding memory (one end in the lateral direction) to be connected (refer to each arrow 261 in the area 710). That is to say, a memory is disposed between the light receiving element of the phase-difference detection pixel including a memory to be connected, and the light receiving element of the image generation pixel. Thereby, in this variation, the area of the connecting surface between a light receiving element of an image generation pixel and a memory becomes uniform for all the image generation pixels.

That is to say, by the arrangement (area 710) of this variation, it is possible to make the structure of the image generation pixel uniform compared with the first embodiment of the present disclosure in which an image generation pixel connected to a long side of a memory and an image generation pixel connected to a short side of a memory are mixed. Thereby, it is possible to reduce noise caused by variations of the structures of image generation pixels, and thereby to improve image quality of a captured image.

FIG. 9B illustrates an arrangement in which every two areas 710 illustrated in FIG. 9A are arranged in a vertical direction and in a horizontal direction. As shown in FIG. 9B, in the case where a light receiving element of all the image generation pixels is connected to a long side of a corresponding memory (one end in the lateral direction) to which the element is connected, it is possible to arrange phase-difference detection pixels so as to form a pair of images.

Figure 10:
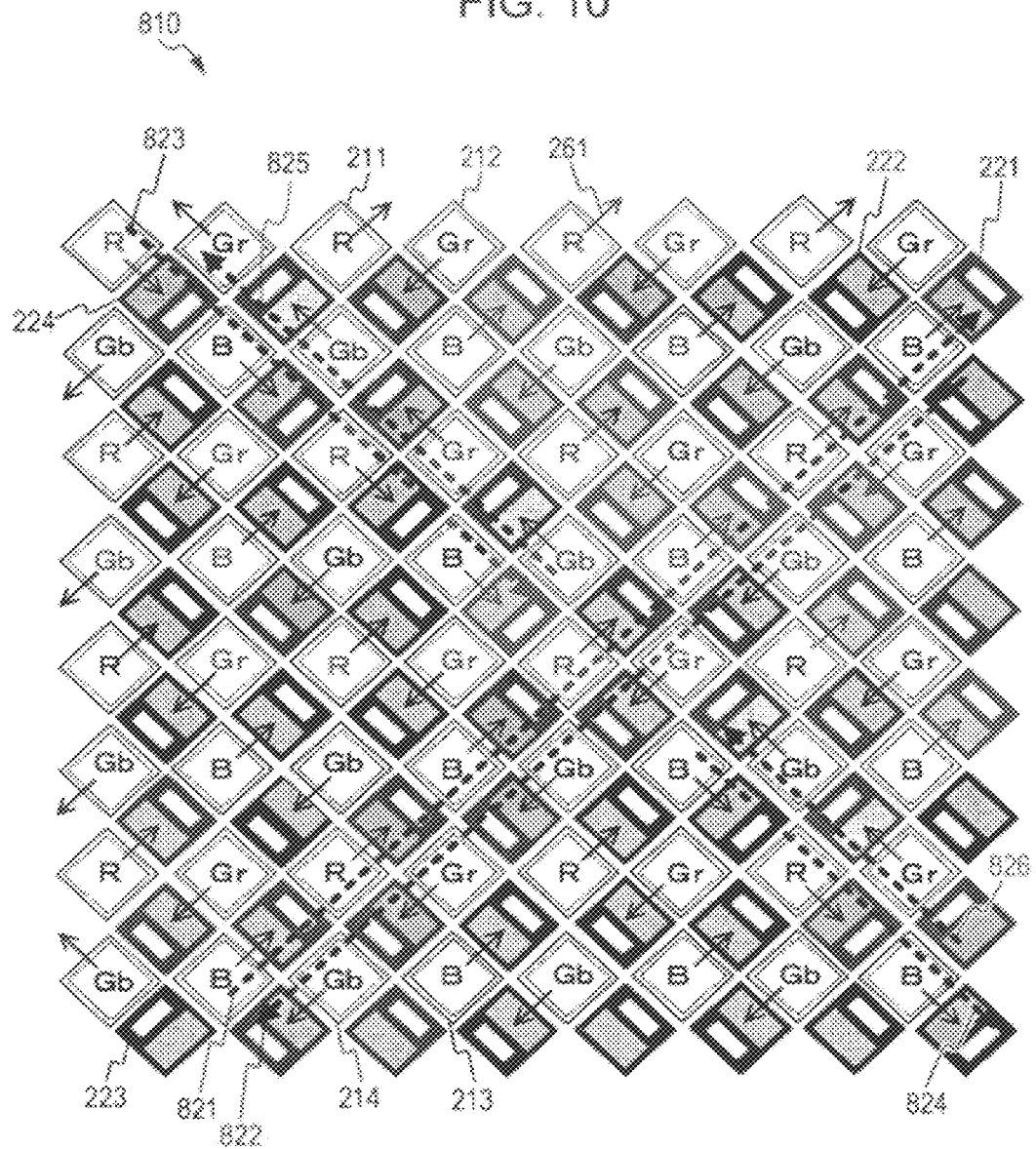
FIG. 10 is a schematic diagram illustrating an example, different from FIG. 9A and FIG. 9B, of a pixel arrangement in which a light receiving element of an image generation pixel is connected only to a long side of a memory (one end in the lateral direction) as a third variation of the first embodiment of the present disclosure.

FIG. 10 is a schematic diagram illustrating an example, different from FIG. 9A and FIG. 9B, of a pixel arrangement in which a light receiving element of an image generation pixel is connected only to a long side of a memory (one end in the lateral direction) as a third variation of the first embodiment of the present disclosure. In this regard, the area (area 810) illustrated in FIG. 10 is a figure corresponding to FIG. 9A. Although a number of pixels, an arrangement pattern of phase-difference detection pixels, and a disposition position of a memory to which a light receiving element of an image generation pixel is connected, etc., are different, FIG. 10 illustrates a pixel arrangement in the same manner as FIG. 9A. Accordingly, a same symbol is given to a same element, and a description thereof will be omitted here.

In FIG. 10, a broken-line arrow (arrow 821) denoting a diagonal line, in which phase-difference detection pixels 221 are arranged in series, and a broken-line arrow (arrow 822) denoting a diagonal line, in which phase-difference detection pixels 222 are arranged in series, are illustrated. Further, in FIG. 10, a broken-line arrow (arrow 823 and arrow 824) denoting a diagonal line, in which phase-difference detection pixels 224 are arranged in series, and a broken-line arrow (arrow 825 and arrow 826) denoting a diagonal line, in which phase-difference detection pixels 223 are arranged in series, are illustrated.

Figure 11:
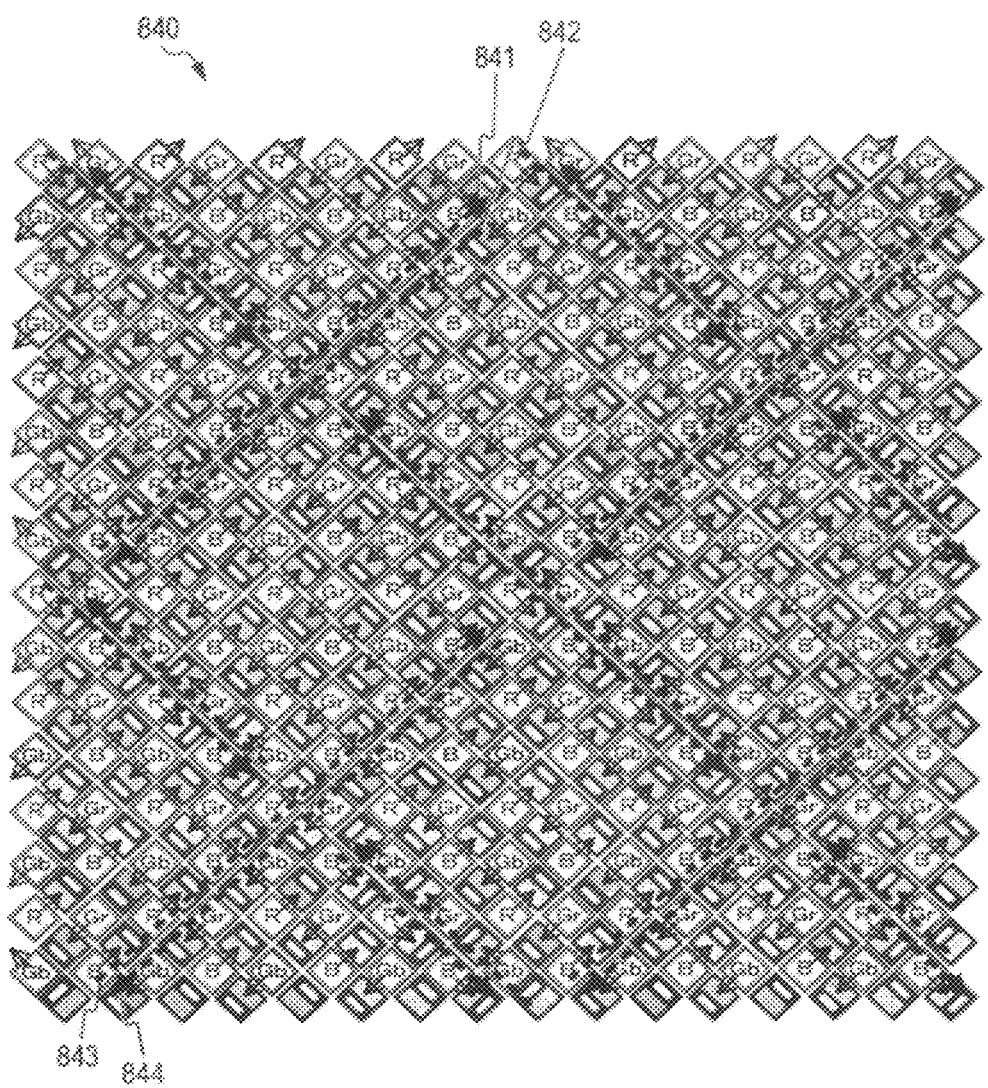
FIG. 11 is a schematic diagram illustrating a pixel arrangement in which every two areas illustrated in FIG. 9A and FIG. 9B are arranged both in a longitudinal direction and in a lateral direction.

FIG. 11 is a schematic diagram illustrating a pixel arrangement in which every two areas 810 illustrated in FIG. 10 are arranged in a vertical direction and in a horizontal direction.

FIG. 11 illustrates a pixel arrangement (area 840) in which every two areas 810 illustrated in FIG. 10 are arranged in the vertical direction and in the horizontal direction. As shown in FIG. 11, when a plurality of areas 810 are arranged in the vertical direction and the horizontal direction, a plurality of lines (arrows 841 and 842) in which seven phase-difference detection pixels performing pupil dividing in an upper-right to lower-left direction are disposed in series are formed, and a plurality of lines (arrows 843 and 844) in which seven phase-difference detection pixels performing pupil dividing in an upper-left to lower-right direction are disposed in series are formed.

That is to say, as shown in FIG. 10 and FIG. 11, in the case where a light receiving element of an image generation pixel is connected to a long side of a memory, it is also possible to dispose pixels so as to generate both a pair of images by pupil dividing in an upper-left to lower-right direction, and a pair of images by pupil dividing in an upper-right to lower-left direction.

In this regard, in FIG. 9 and FIG. 10, descriptions have been given of the case where a light receiving element of an image generation pixel is connected only to a long side of a memory (one end in the lateral direction). However, the present disclosure is not limited to this. For example, in the case where a light receiving element of an image generation pixel is connected only to a short side of a memory (one end in the longitudinal direction), although the area of a connection surface becomes small, it is possible to reduce noise caused by variations of the structures of the image generation pixel, and thus to improve image quality of a captured image.

In this manner, according to an embodiment of the present disclosure, a memory for a global shutter function of an image generation pixel is disposed in a shielded area of a phase-difference detection pixel so that it is possible to curb a decrease in the area of a light receiving element of an imaging device having a global shutter function. Thereby, it is possible to curb a decrease in the amount of receiving light caused by a decrease in light-collection area, and to reduce deterioration of image quality caused by a decrease in the dynamic range, etc.

Also, as shown by the first embodiment of the present disclosure, although phase-difference detection pixels and image generation pixels are disposed on a light receiving element, intervals between the image generation pixels become uniform by employing a diagonal pixel array, and thus the image quality improves.

Also, by an embodiment of the present disclosure, the number of phase-difference detection pixels becomes larger than that of a related-art light receiving element provided with both phase-difference detection pixels and image generation pixels. Accordingly, it is possible to improve precision of phase-difference detection.

Also, by an embodiment of the present disclosure, it is possible to make the size of a phase-difference detection pixel and the size of an image generation pixel identical, and thus to easily design and manufacture an imaging device.

In this regard, in the embodiments of the present disclosure, descriptions have been given on the assumption that the color filters included in the image generation pixels are color filters of the three primary colors (RGB). However, the present disclosure is not limited to this. For example, the present disclosure can also be applied to the case where image generation pixels are provided with color filters of complementary colors in the same manner.

Also, in the embodiments of the present disclosure, a description has been given on the assumption of a front-side illuminated image sensor in which a wiring layer is disposed on a front side of a light receiving element (a light incident plane side). However, the present disclosure is not limited to this. In the case of a back-side image sensor in which a wiring layer is disposed on a back side of a light receiving element (the opposite side of a light incident plane side), it is also possible to implement the image sensor in the same manner as the embodiments of the present disclosure by disposing a memory on an area shielded from subject light by a light shielding layer of a phase-difference detection pixel.

Also, in the embodiments of the present disclosure, a description has been given on the assumption that a light receiving element of an image generation pixel has a square form, and a light receiving element and a memory of a phase-difference detection pixel have a form of a square divided into two parts (rectangle). However, the present disclosure is not limited to this. It is possible to implement the image sensor in the same manner as the embodiments of the present disclosure in the case where a light receiving element of an image generation pixel has a polygonal form or a circular form.

In this regard, the embodiments of the present disclosure are examples of carrying out the present disclosure. As specifically described in the embodiments of the present disclosure, items of the embodiments of the present disclosure and specific items in the claims have corresponding relationships, respectively. In the same manner, specific items of the disclosure in the claims and the embodiments of the present disclosure having the same names have corresponding relationships, respectively. However, the present disclosure is not limited to the embodiments, various variations may be made in the embodiments without departing from the spirit and scope of the disclosure.

Also, the processing procedure described in the embodiments of the present disclosure may be construed as a method of a series of the procedure. Also, the processing procedure may be construed as a program for executing the series of the procedure, or a recording medium on which the program is stored. For the recording medium, for example, a CD (Compact Disc), an MD (MiniDisc), a DVD (Digital Versatile Disk), a memory card, a Blu-ray Disc (registered trademark), etc., can be used.

The present disclosure contains subject matter related to that disclosed in Japanese Priority Patent Application JP 2011-010323 filed in the Japan Patent Office on Jan. 21, 2011, the entire contents of which are hereby incorporated by reference.

What is claimed is:

1. An imaging device comprising:
an image generation pixel including a light receiving element generating a signal for generating an image;
a phase-difference detection pixel including a light receiving element generating a signal for performing in-focus determination by phase difference detection; and
a memory that stores the signal generated by the light receiving element in the image generation pixel and is disposed in an area where subject light is shielded by a light shielding layer in the phase-difference detection pixel,
wherein at least one pixel among individual pixels adjacent to the image generation pixel is the phase-difference detection pixel, and one end of the memory in a longitudinal direction in the phase-difference detection pixel and the light receiving element in the image generation pixel are adjacent to each other.

2. The imaging device according to claim 1,
wherein the memory is disposed between the light receiving element in the image generation pixel and the light receiving element in the phase-difference detection pixel.

3. The imaging device according to claim 1,
wherein the image generation pixels and the phase-difference detection pixels are arranged such that a first line including the image generation pixels arranged in a specific direction and a second line including the phase-difference detection pixels arranged in the specific direction are alternately disposed in an orthogonal direction to the specific direction.

4. The imaging device according to claim 3,
wherein the image generation pixels and the phase-difference detection pixels are arranged alternately such that the image generation pixels included in the first line and the phase-difference detection pixels included in the second line adjacent to the first line are partly overlapped in the orthogonal direction.

5. The imaging device according to claim 4,
wherein the image generation pixels and the phase-difference detection pixels are arranged in a diagonal pixel array.

6. The imaging device according to claim 5,
wherein the phase-difference detection pixel is a phase-difference detection pixel performing pupil dividing in a diagonal direction with respect to the specific direction.

7. The imaging device according to claim 3,
wherein the image generation pixel and the phase-difference detection pixel are substantially square pixels individually having one side in parallel with the specific direction, and are arranged in a tetragonal lattice.

8. The imaging device according to claim 1,
wherein
the memory alternately stores the signal generated by the light receiving element in the phase-difference detection pixel and the signal generated by the light receiving element in the image generation pixel for each frame.

9. An imaging apparatus comprising:
an imaging device including an image generation pixel including a light receiving element generating a signal for generating an image, a phase-difference detection pixel including a light receiving element generating a signal for performing in-focus determination by phase difference detection, and a memory that stores the signal generated by the light receiving element in the image generation pixel and is disposed in an area where subject light is shielded by a light shielding layer in the phase-difference detection pixel;
an in-focus determination section performing in-focus determination by phase difference detection on the basis of the signal generated by the phase-difference detection pixel; and
a control section controlling drive of a lens on the basis of an in-focus determination result by the in-focus determination section,
wherein at least one pixel among individual pixels adjacent to the image generation pixel is the phase-difference detection pixel, and one end of the memory in a longitudinal direction in the phase-difference detection pixel and the light receiving element in the image generation pixel are adjacent to each other.

* * * * *